US012656694B2

(12) United States Patent
Ridinger et al.

(10) Patent No.: US 12,656,694 B2
(45) Date of Patent: Jun. 16, 2026

(54) LITHOGRAPHIC APPARATUS, ILLUMINATION SYSTEM, AND CONNECTION SEALING DEVICE WITH PROTECTIVE SHIELD

(71) Applicant: ASML Netherlands B.V., Veldhoven (NL)

(72) Inventors: Armin Bernhard Ridinger, San Diego, CA (US); Muchen Xu, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 154 days.

(21) Appl. No.: 18/724,144

(22) PCT Filed: Nov. 22, 2022

(86) PCT No.: PCT/EP2022/082748
§ 371 (c)(1),
(2) Date: Jun. 25, 2024

(87) PCT Pub. No.: WO2023/126107
PCT Pub. Date: Jul. 6, 2023

(65) Prior Publication Data
US 2025/0060682 A1     Feb. 20, 2025

Related U.S. Application Data

(60) Provisional application No. 63/294,369, filed on Dec. 28, 2021.

(51) Int. Cl.
*G03F 7/20* (2006.01)
*G03F 7/00* (2006.01)

(52) U.S. Cl.
CPC ...... *G03F 7/70808* (2013.01); *G03F 7/70033* (2013.01); *G03F 7/702* (2013.01); *G03F 7/70233* (2013.01); *G03F 7/70916* (2013.01)

(58) Field of Classification Search
CPC .. G03F 7/70808; G03F 7/70033; G03F 7/702; G03F 7/70233; G03F 7/70916;
(Continued)

(56) References Cited

U.S. PATENT DOCUMENTS

| 7,372,056 B2 | 5/2008 | Bykanov et al. |
| 7,405,416 B2 | 7/2008 | Algots et al. |

(Continued)

FOREIGN PATENT DOCUMENTS

| EP | 0 659 942 A2 | 6/1995 |
| JP | 2002-134384 A | 5/2002 |
| WO | WO 2019/137846 A1 | 7/2019 |

OTHER PUBLICATIONS

International Search Report and Written Opinion of the International Searching Authority directed to International Patent Application No. PCT/EP2022/082748, mailed Mar. 13, 2023; 10 pages.
(Continued)

*Primary Examiner* — Mesfin T Asfaw
(74) *Attorney, Agent, or Firm* — Finnegan, Henderson, Farabow, Garrett & Dunner LLP

(57) ABSTRACT

A lithographic apparatus includes an illumination system to illuminate a pattern of a patterning device and a projection system to project an image of the pattern onto a substrate. The illumination system includes a first and second enclosures, a scaling device, and a protective device. The first enclosure encloses a first environment and includes a first opening and first connection corresponding to the first opening. The second enclosure includes a second connection structure to couple to the first connection structure to prevent mixing of substances between the first environment and a second environment outside of the first and second enclosures. The sealing device is disposed between the first and second connection structures. The material of the sealing device is chemically reactive to the first environment. The
(Continued)

protective device is disposed on the sealing device proximal to the first environment to shield the sealing device from the first environment.

20 Claims, 8 Drawing Sheets

(58) Field of Classification Search
CPC ........ G03F 7/708; F16J 15/104; F16J 15/125;
F16L 23/02; F16L 23/18
See application file for complete search history.

(56) References Cited

U.S. PATENT DOCUMENTS

| | | |
|---|---|---|
| 7,872,245 B2 | 1/2011 | Vaschenko et al. |
| 2003/0117600 A1 | 6/2003 | Taniuchi et al. |
| 2006/0215136 A1* | 9/2006 | Fujimoto ............ G03F 7/70841 |
| | | 355/53 |

OTHER PUBLICATIONS

International Preliminary Report on Patentability directed to International Patent Application No. PCT/EP2022/082748, issued Jun. 20, 2024; 8 pages.

* cited by examiner

LITHOGRAPHIC APPARATUS, ILLUMINATION SYSTEM, AND CONNECTION SEALING DEVICE WITH PROTECTIVE SHIELD

CROSS REFERENCE TO RELATED APPLICATIONS

This application claims priority to U.S. Application No. 63/294,369 filed Dec. 28, 2021, titled LITHOGRAPHIC APPARATUS, ILLUMINATION SYSTEM, AND CONNECTION SEALING DEVICE WITH PROTECTIVE SHIELD, which is incorporated herein in its entirety by reference.

FIELD

The present application relates to a seal for connecting two structures in a leak-proof manner. In one exemplary application, a gasket seal may be used to seal a connection between two conduits. Such connections may be present in, for example, an EUV source for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

A lithographic apparatus typically includes an illumination system that conditions radiation generated by a radiation source before the radiation is incident upon a patterning device. A patterned beam of EUV light can be used to produce extremely small features on a substrate. Extreme ultraviolet light (also sometimes referred to as soft x-rays) is generally defined as electromagnetic radiation having wavelengths in the range of about 5-100 nm. One particular wavelength of interest for photolithography occurs at 13.5 nm.

Methods to produce EUV light include, but are not necessarily limited to, converting a source material into a plasma state that has a chemical element with an emission line in the EUV range. These elements can include, but are not necessarily limited to, xenon, lithium and tin.

In one such method, often termed laser produced plasma ("LPP"), the desired plasma can be produced by irradiating a source material, for example, in the form of a droplet, stream or wire, with a laser beam. In another method, often termed discharge produced plasma ("DPP"), the required plasma can be generated by positioning source material having an appropriate emission line between a pair of electrodes and causing an electrical discharge to occur between the electrodes.

One technique for generating droplets involves melting a target material such as tin and then forcing it under high pressure through a relatively small diameter orifice to produce a stream of droplets that interact with a laser to induce a plasma that produces EUV radiation. The heat of the molten droplets, as well as the harsh environment of the EUV chamber (EUV photons), can corrode or otherwise adversely impact sensitive structures, such as gasket connections for example. Furthermore, such issues can be relevant to any application in general (e.g., other than EUV-generation) in which a controlled environment attacks the structures that are responsible for containing the controlled environment.

SUMMARY

Accordingly, it is desirable to improve connection apparatuses that are adversely impacted by being exposed to corrosive or otherwise damaging environments.

In some embodiments, a lithographic apparatus comprises an illumination system configured to illuminate a pattern of a patterning device and a projection system configured to project an image of the pattern onto a substrate. The illumination system comprises first and second enclosures, a sealing device, and a protective device. The first enclosure comprises a first opening and a first connection structure corresponding to the first opening. The first enclosure is configured to enclose a first environment. The second enclosure comprises a second connection structure configured to couple to the first connection structure to prevent mixing of substances between the first environment and a second environment outside of the first and second enclosures. The sealing device is configured to be disposed between the first and second connection structures to prevent the mixing of the substances. A material of the sealing device is configured to be chemically reactive to the first and second environment. The protective device is configured to be disposed on the sealing device proximal to the first environment to shield the sealing device from the first environment.

In some embodiments, a system comprises first and second enclosures, a sealing device, and a protective device. The first enclosure comprises a first opening and a first connection structure corresponding to the first opening. The first enclosure is configured to enclose a first environment. The second enclosure comprises a second connection structure configured to couple to the first connection structure to prevent mixing of substances between the first environment and a second environment outside of the first and second enclosures. The sealing device is configured to be disposed between the first and second connection structures to prevent the mixing of the substances. A material of the sealing device is configured to be chemically reactive to the first and second environment. The protective device is configured to be disposed on the sealing device proximal to the first environment to shield the sealing device from the first environment.

In some embodiments, an illumination system comprises an extreme ultraviolet radiation source, first and second enclosures, a sealing device, and a protective device. The first enclosure comprises a first opening and a first connection structure corresponding to the first opening. The first enclosure is configured to enclose a first environment. The second enclosure comprises a second connection structure configured to couple to the first connection structure to prevent mixing of substances between the first environment and a second environment outside of the first and second enclosures. The sealing device is configured to be disposed between the first and second connection structures to prevent the mixing of the substances. A material of the sealing device is configured to be chemically reactive to the first and second environment. The protective device is configured to be disposed on the sealing device proximal to the first environment to shield the sealing device from the first environment.

Further features of various embodiments of the present disclosure are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1:
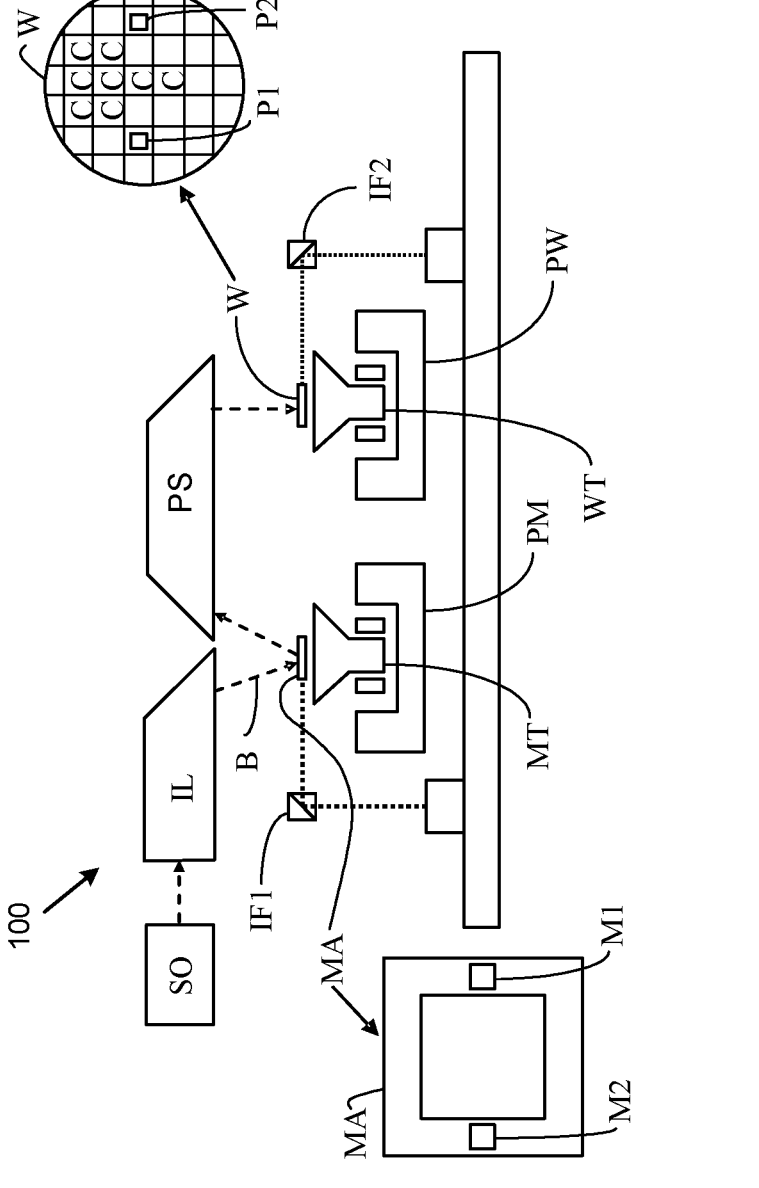
FIG. 1 shows a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" may be used herein indicates the value of a given quantity that can vary based on a particular technology. Based on the particular technology, the term "about" may indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

FIG. 1 shows a lithographic apparatus 100 in which embodiments of the present disclosure may be implemented. Lithographic apparatus 100 includes the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 also has a projection system PS configured to project a pattern imparted to the radiation beam B by patterning device MA onto a target portion (for example, comprising one or more dies) C of the substrate W. In lithographic apparatus 100, the patterning device MA and the projection system PS are reflective.

The illumination system IL may include various types of optical components, such as refractive, reflective, catadioptric, magnetic, electromagnetic, electrostatic, or other types of optical components, or any combination thereof, for directing, shaping, or controlling the radiation beam B. The illumination system IL may also include a sensor ES that provides a measurement of, for example, one or more of energy per pulse, photon energy, intensity, average power, and the like. The illumination system IL may include a measurement sensor MS for measuring a movement of the radiation beam B and uniformity compensators UC that allow an illumination slit uniformity to be controlled. The measurement sensor MS may also be disposed at other locations. For example, the measurement sensor MS may be on or near the substrate table WT.

The support structure MT holds the patterning device MA in a manner that depends on the orientation of the patterning device MA with respect to a reference frame, the design of lithographic apparatus 100, and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be reflective. Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The illuminator IL receives a radiation beam from a radiation source SO. The source SO and the lithographic apparatus 100 may be separate physical entities, for example, when the source SO is an excimer laser. In such cases, the source SO is not considered to form part of the lithographic apparatus 100 and the radiation beam B passes from the source SO to the illuminator IL with the aid of a beam delivery system BD (not shown) including, for example, suitable directing mirrors and/or a beam expander. In other cases, the source SO may be an integral part of the lithographic apparatus 100, for example, when the source SO is a mercury lamp. The source SO and the illuminator IL, together with the beam delivery system BD, if required, may be referred to as a radiation system.

To not overcomplicate the drawing, the illuminator IL may include other components that are not shown. For example, the illuminator IL may include an adjuster for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. The illuminator IL may comprise an integrator and/or a condenser (not shown). The illuminator IL may be used to condition the radiation beam B to have a desired uniformity and intensity distribution in its cross section. The desired uniformity of radiation beam B may be maintained by using a uniformity compensator. Uniformity compensator comprises a plurality of protrusions (e.g., fingers) that may be adjusted in the path of radiation beam B to control the uniformity of radiation beam B. A sensor may be used to monitor the uniformity of radiation beam B.

The radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

The lithographic apparatus 100 may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-) magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes EUV radiation source configured to generate a beam of EUV radiation for EUV lithography. In general, the EUV radiation source is configured in a radiation system, and a corresponding illumination system is configured to condition the EUV radiation beam of the EUV source.

Figure 2A:
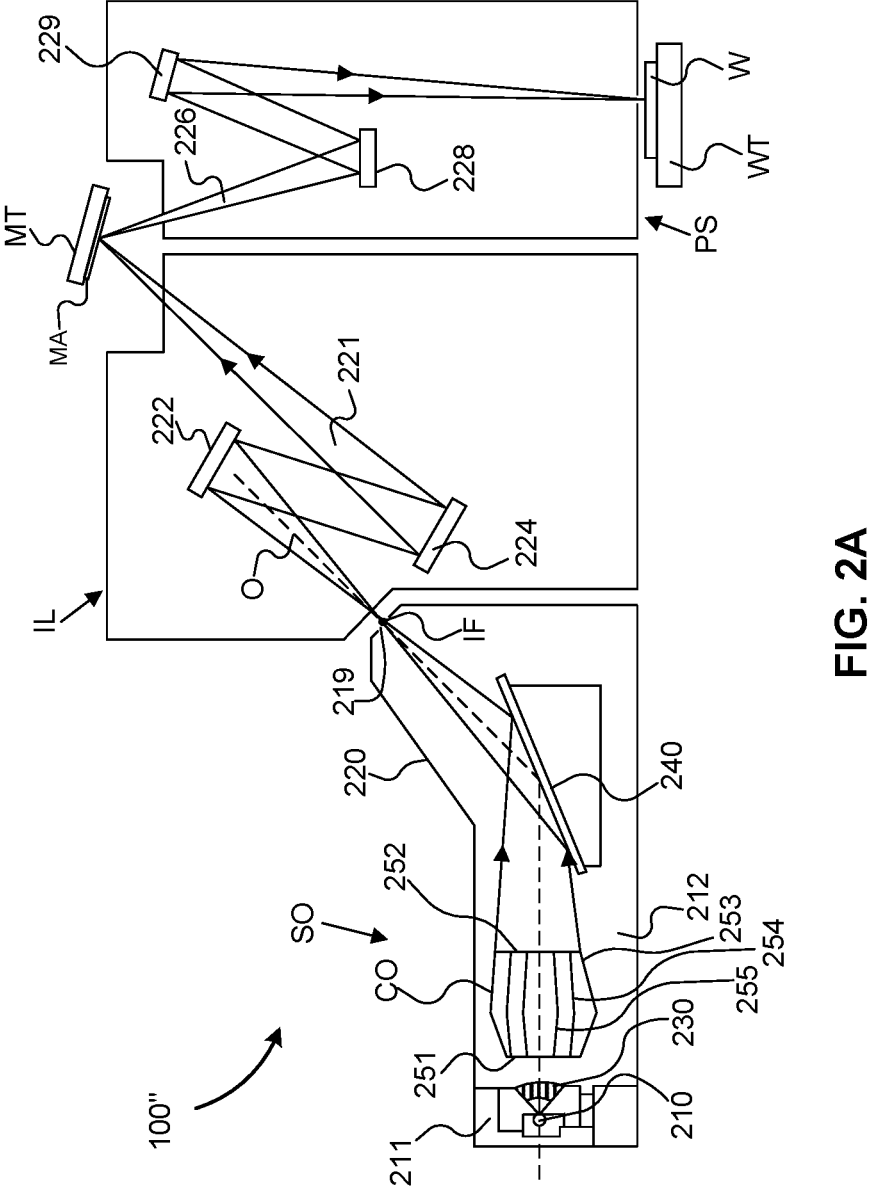
FIGS. 2A, 2B, and 3 show more details of a reflective lithographic apparatus, according to some embodiments.

FIG. 2A shows the lithographic apparatus 100 (e.g., FIG. 1) in more detail, including the source collector apparatus SO, the illumination system IL, and the projection system PS, according to some embodiments. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) (e.g., excited via a laser) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point INTF. The virtual source point INTF is commonly referred to as the intermediate focus, and the source collector apparatus is arranged such that the intermediate focus INTF is located at or near an opening 219 in the enclosing structure 220. The virtual source point INTF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2A, for example there may be one to six additional reflective elements present in the projection system PS than shown in FIG. 2A.

In some embodiments, illumination optics unit IL may include a sensor ES that provides a measurement of, for example, one or more of energy per pulse, photon energy, intensity, average power, and the like. Illumination optics unit IL may include a measurement sensor MS for measuring a movement of the radiation beam B and uniformity compensators UC that allow an illumination slit uniformity to be controlled. The measurement sensor MS may also be disposed at other locations. For example, the measurement sensor MS may be on or near the substrate table WT.

Collector optic CO, as illustrated in FIG. 2A, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Figure 2B:
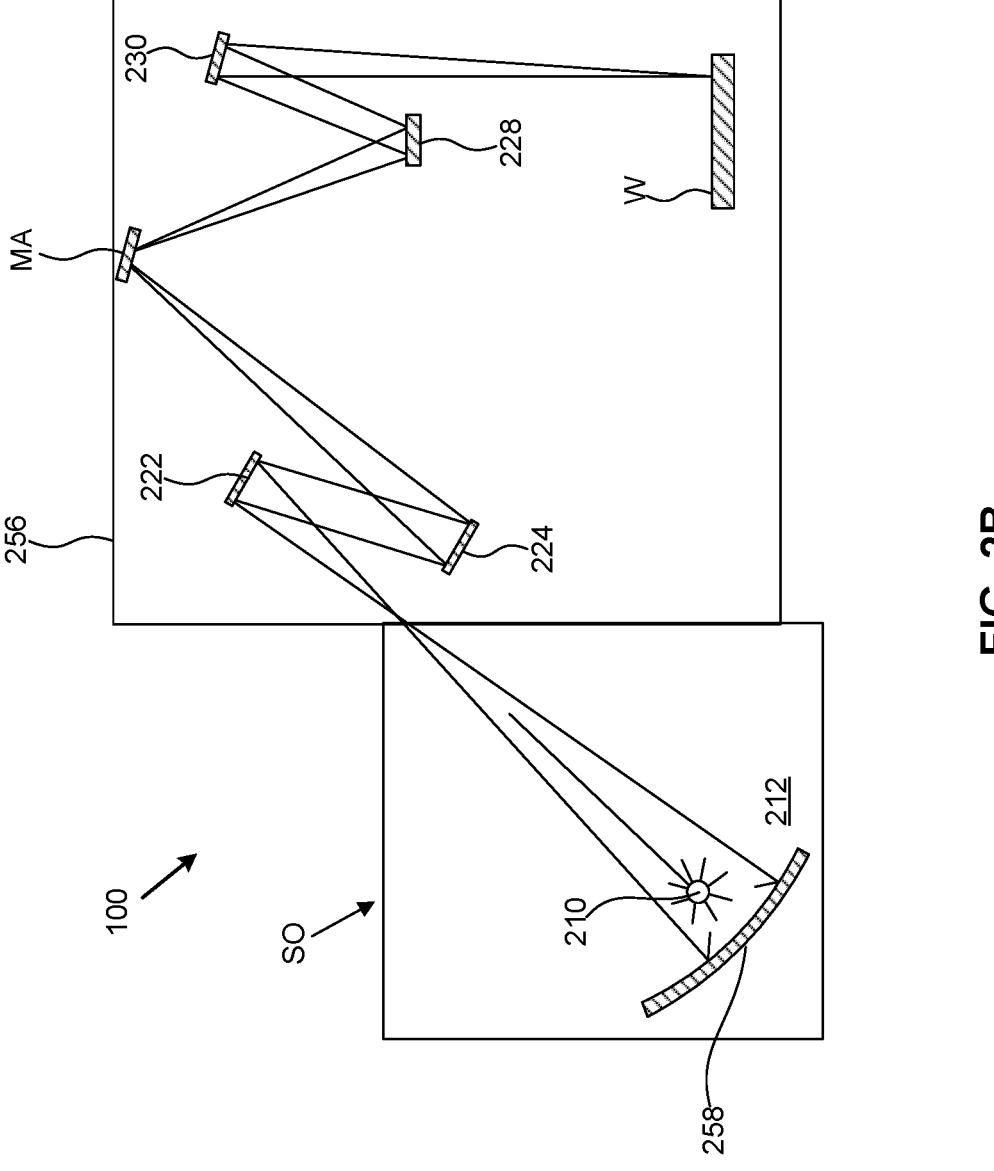

FIG. 2B shows selected portions of lithographic apparatus 100 (e.g., FIG. 1), but with alternative collection optics in the source collector apparatus SO, according to some embodiments. It should be appreciated that structures shown in FIG. 2A that do not appear in FIG. 2B (for drawing clarity) may still be included in embodiments referring to FIG. 2B. Elements in FIG. 2B having the same reference numbers as those in FIG. 2A have the same or substantially similar structures and functions as described in reference to FIG. 2A. In some embodiments, the lithographic apparatus 100 may be used, for example, to expose a substrate W such as a resist coated wafer with a patterned beam of EUV light. In FIG. 2B, the illumination system IL and the projection system PS are represented combined as an exposure device 256 (e.g., an integrated circuit lithography tool such as a stepper, scanner, step and scan system, direct write system, device using a contact and/or proximity mask, etc.) that uses EUV light from the source collector apparatus SO. The lithographic apparatus 100 may also include collector optic 258 that reflects EUV light from the hot plasma 210 along a path into the exposure device 256 to irradiate the substrate W. Collector optic 258 may comprise a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers.

Figure 3:
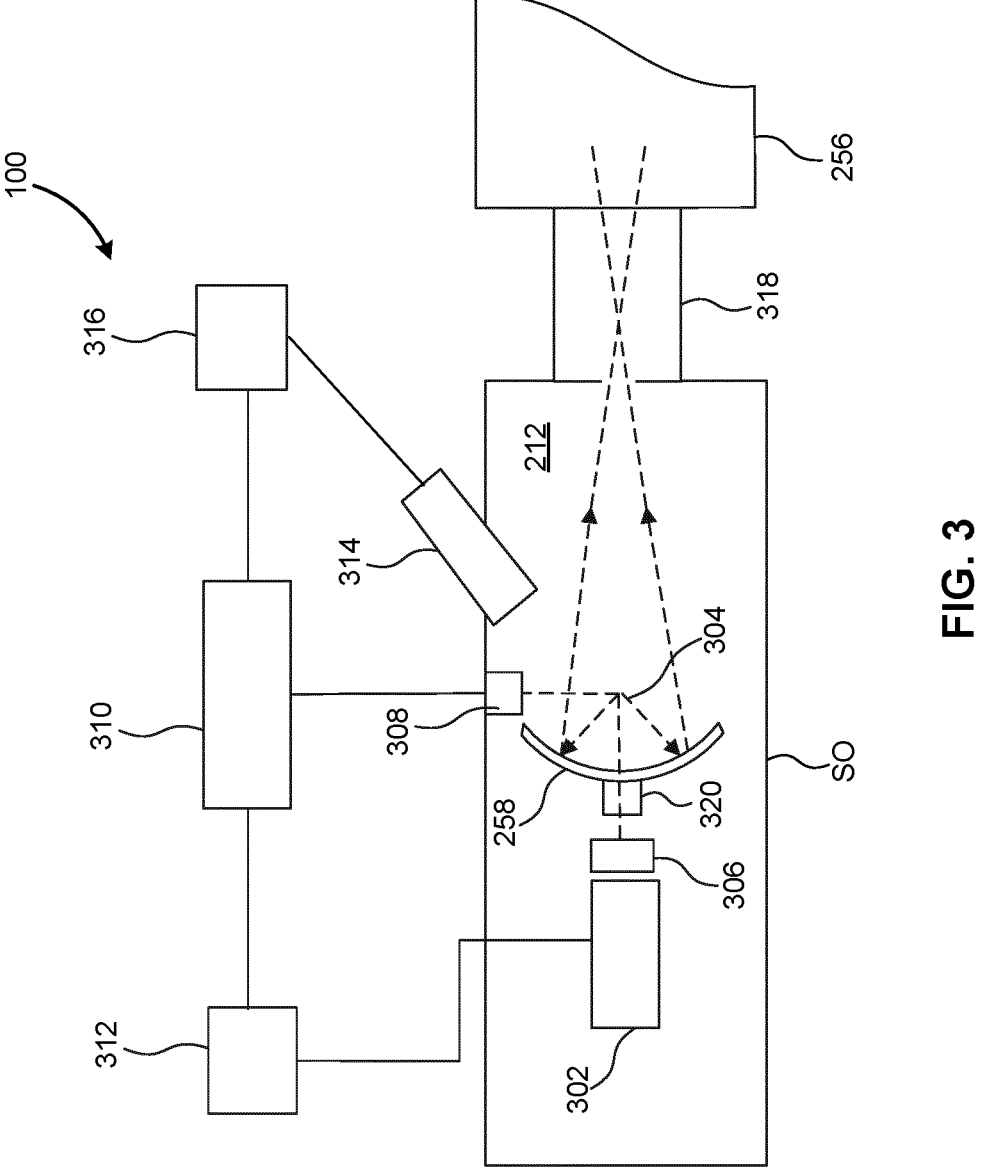

FIG. 3 shows a detailed view of a portion of lithographic apparatus 100 (e.g., FIGS. 1, 2A, and 2B), according to one or more embodiments. Elements in FIG. 3 having the same reference numbers as those in FIGS. 1, 2A, and 2B have the same or substantially similar structures and functions as described in reference to FIGS. 1, 2A, and 2B. In some embodiments, lithographic apparatus 100 may include a source collector apparatus SO having an LPP EUV light radiator. As shown, the source collector apparatus SO may include a laser system 302 for generating a train of light pulses and delivering the light pulses into a light source chamber 212. For the lithographic apparatus 100, the light pulses may travel along one or more beam paths from the laser system 302 and into the chamber 212 to illuminate a source material at an irradiation region 304 to generate a plasma (e.g., plasma region where hot plasma 210 is in FIG. 2B) that produces EUV light for substrate exposure in the exposure device 256.

In some embodiments, suitable lasers for use in the laser system 302 may include a pulsed laser device, e.g., a pulsed gas discharge $CO_2$ laser device producing radiation at 9.3 pm or 10.6 pm, e.g., with DC or RF excitation, operating at relatively high power, e.g., 10 kW or higher and high pulse repetition rate, e.g., 50 kHz or more. In some embodiments, the laser may be an axial-flow RF-pumped $CO_2$ laser having an oscillator amplifier configuration (e.g., master oscillator/power amplifier (MOPA) or power oscillator/power amplifier (POPA)) with multiple stages of amplification and having a seed pulse that is initiated by a Q-switched oscillator with relatively low energy and high repetition rate, e.g., capable of 100 kHz operation. From the oscillator, the laser pulse may then be amplified, shaped and/or focused before reaching the irradiation region 304. Continuously pumped $CO_2$ amplifiers may be used for the laser system 302. Alternatively, the laser may be configured as a so-called "self-targeting" laser system in which the droplet serves as one mirror of the optical cavity of the laser.

In some embodiments, depending on the application, other types of lasers may also be suitable, e.g., an excimer or molecular fluorine laser operating at high power and high pulse repetition rate. Some examples include, a solid state laser, e.g., having a fiber, rod, slab, or disk-shaped active media, other laser architectures having one or more chambers, e.g., an oscillator chamber and one or more amplifying chambers (with the amplifying chambers in parallel or in series), a master oscillator/power oscillator (MOPO) arrangement, a master oscillator/power ring amplifier (MO-PRA) arrangement, or a solid state laser that seeds one or more excimer, molecular fluorine or $CO_2$ amplifier or oscillator chambers, may be suitable. Other suitable designs may be envisioned.

In some embodiments, a source material may first be irradiated by a pre-pulse and thereafter irradiated by a main pulse. Pre-pulse and main pulse seeds may be generated by a single oscillator or two separate oscillators. One or more common amplifiers may be used to amplify both the pre-pulse seed and main pulse seed. In some embodiments, separate amplifiers may be used to amplify the pre-pulse and main pulse seeds.

In some embodiments, the lithographic apparatus 100 may include a beam conditioning unit 306 having one or more optics for beam conditioning such as expanding, steering, and/or focusing the beam between the laser system 302 and irradiation region 304. For example, a steering system, which may include one or more mirrors, prisms, lenses, etc., may be provided and arranged to steer the laser focal spot to different locations in the chamber 212. For example, the steering system may include a first flat mirror mounted on a tip-tilt actuator which may move the first mirror independently in two dimensions, and a second flat mirror mounted on a tip-tilt actuator which may move the second mirror independently in two dimensions. With the described arrangement(s), the steering system may controllably move the focal spot in directions substantially orthogonal to the direction of beam propagation (beam axis or optical axis).

The beam conditioning unit 306 may include a focusing assembly to focus the beam to the irradiation region 304 and adjust the position of the focal spot along the beam axis. For the focusing assembly, an optic, such as a focusing lens or mirror, may be used that is coupled to an actuator for movement in a direction along the beam axis to move the focal spot along the beam axis.

In some embodiments, the source collector apparatus SO may also include a source material delivery system 308, e.g., delivering source material, such as liquid tin droplets, into the interior of chamber 212 to an irradiation region 304, where the droplets will interact with light pulses from the laser system 302, to ultimately produce plasma and generate an EUV emission to expose a substrate such as a resist coated wafer in the exposure device 256. More details regarding various droplet dispenser configurations may be found in, e.g., U.S. Pat. No. 7,872,245, issued on Jan. 18, 2011, titled "Systems and Methods for Target Material Delivery in a Laser Produced Plasma EUV Light Source", U.S. Pat. No. 7,405,416, issued on Jul. 29, 2008, titled "Method and Apparatus For EUV Plasma Source Target Delivery", U.S. Pat. No. 7,372,056, issued on May 13, 2008, titled "LPP EUV Plasma Source Material Target Delivery System", and International Appl. No. WO 2019/137846, titled "Apparatus for and Method of Controlling Coalescence of Droplets In a Droplet Stream", published on Jul. 18, 2019, the contents of each of which are incorporated by reference herein in their entirety.

In some embodiments, the source material for producing an EUV light output for substrate exposure may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the source material may be presented to the irradiation region at various temperatures including room temperature or near room temperature (e.g., tin alloys, $SnBr_4$), at an elevated temperature, (e.g., pure tin) or at temperatures below room temperature, (e.g., $SnH_4$). In some cases, the material may be relatively volatile, e.g., $SnBr_4$.

In some embodiments, the lithographic apparatus 100 may also include a controller 310, which may also include a drive laser control system 312 for controlling devices in the laser system 302 to thereby generate light pulses for delivery into the chamber 212, and/or for controlling movement of optics in the beam conditioning unit 306. The lithographic apparatus 100 may also include a droplet position detection system which may include one or more droplet imagers 314 that provide an output signal indicative of the position of one or more droplets, e.g., relative to the irradiation region 304. The droplet imager(s) 314 may provide this output to a droplet position detection feedback system 316, which can, e.g., compute a droplet position and trajectory, from which a droplet error may be computed, e.g., on a droplet-by-droplet basis, or on average. The droplet error may then be provided as an input to the controller 310, which can, for example, provide a position, direction and/or timing correction signal to the laser system 302 to control laser trigger timing and/or to control movement of optics in the beam conditioning unit 306, e.g., to change the location and/or focal power of the light pulses being delivered to the irradiation region 304 in the chamber 212. Also for the source collector apparatus SO, the source material delivery system 308 may have a control system operable in response to a signal (which in some implementations may include the droplet error described above, or some quantity derived therefrom) from the controller 310, to e.g., modify the release point, initial droplet stream direction, droplet release timing and/or droplet modulation to correct for errors in the droplets arriving at the irradiation region 304.

In some embodiments, the lithographic apparatus 100 may also include a collector optic a gas dispenser device 320. Gas dispenser device 320 may dispense gas in the path of the source material from the source material delivery system 308 (e.g., irradiation region 304). Gas dispenser device 320 may comprise a nozzle through which dispensed gas may exit. Gas dispenser device 320 may be structured (e.g., having an aperture) such that, when placed near the optical path of laser system 302, light from laser system 302 is not blocked by gas dispenser device 320 and is allowed to reach the irradiation region 304. A buffer gas such as hydrogen, helium, argon or combinations thereof, may be introduced into, replenished and/or removed from the chamber 212. The buffer gas may be present in the chamber 212 during plasma discharge and may act to slow plasma created ions, to reduce degradation of optics, and/or increase plasma efficiency. Alternatively, a magnetic field and/or electric field (not shown) may be used alone, or in combination with a buffer gas, to reduce fast ion damage.

In some embodiments, the lithographic apparatus 100 may also include a collector optic 258 such as a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. Collector optic 258 may be formed with an aperture to allow the light pulses generated by the laser system 302 to pass through and reach the irradiation region 304. The same, or another similar aperture, may be used to allow gas from the gas dispenser device 320 to flow into chamber 212. As shown, the collector optic 258 may be, e.g., a prolate spheroid mirror that has a first focus within or near the irradiation region 304 and a second focus at a so-called intermediate region 318, where the EUV light may be output from the source collector apparatus SO and input to an exposure device 256 utilizing EUV light, e.g., an integrated circuit lithography tool. It is to be appreciated that other optics may be used in place of the prolate spheroid mirror for collecting and directing light to an intermediate location for subsequent delivery to a device utilizing EUV light. Embodiments using the collector optic CO (FIG. 2A) with structures and functions described in reference to FIG. 3 may also be envisioned.

Exemplary Lithographic Cell

Figure 4:
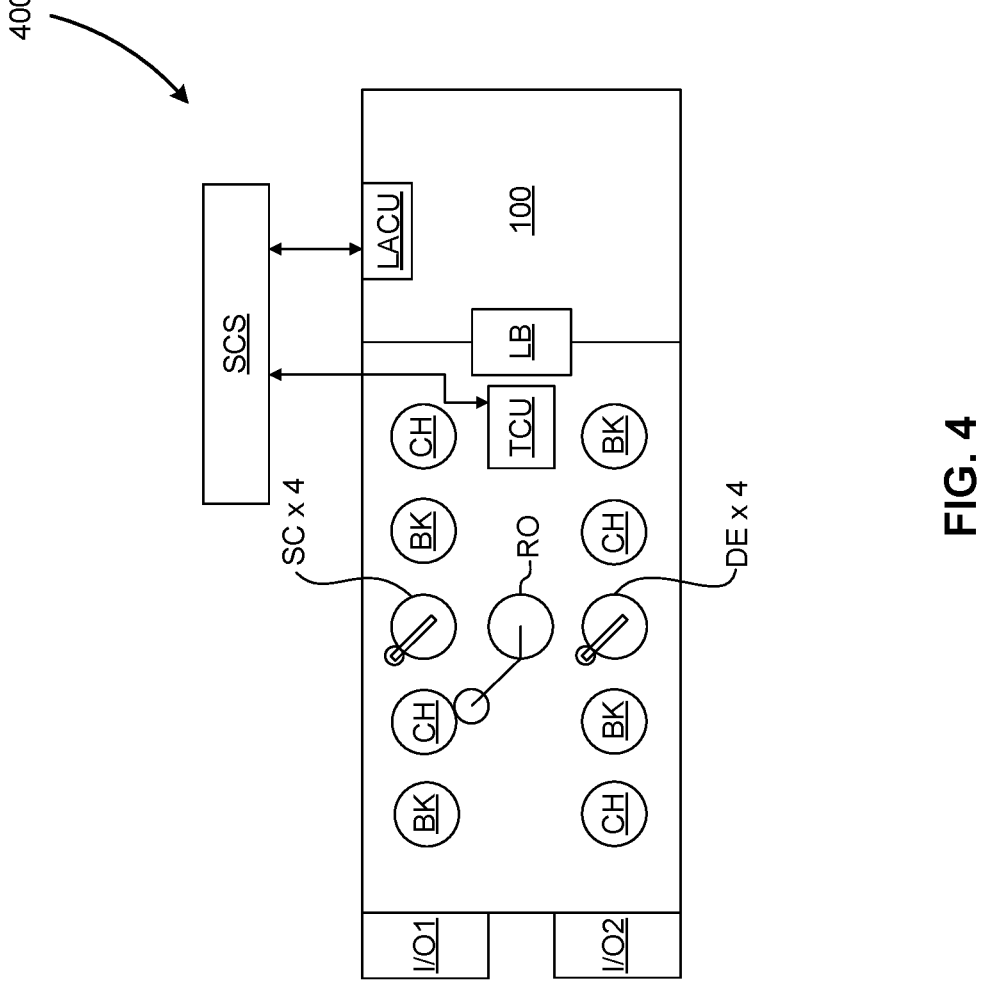
FIG. 4 shows a lithographic cell, according to some embodiments.

FIG. 4 shows a lithographic cell 400, also sometimes referred to a lithocell or cluster, according to some embodiments. Lithographic apparatus 100 may form part of lithographic cell 400. Lithographic cell 400 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Mechanical Seal and Protective Shield

Enclosed environments (e.g., enclosing structure 220 of FIG. 2A) may impose potentially harsh conditions to mechanical structures. For example, liquid tin and/or hydrogen can chemically interact with the material of sealing gaskets, leading to degradation of the gaskets. High temperatures or large temperature variations can also cause oxidation or degradation of the sealing devices. The influence of corrosion, thermal oxidation and/or thermal degradation of the seal material may result in shortened lifetime of sealing devices. In certain applications, the shortened lifetime of components may result in large costs to the user. For example, in lithography applications, replacing a corroded gasket may cause the lithographic apparatus to be inoperable for hours or days. The lost production time in IC fabrication may be significant.

Solutions that address chemical concerns of sealing devices (e.g., using chemically resistant material) may not be able to address thermal oxidation or thermal degradation issues. From another viewpoint, solutions for thermal oxidation or thermal degradation may not resolve chemical issues. For example, an elastomer material can be considered chemically resistant to some environments. However, elastomer seals may lose contact sealing force over repeated thermal cycles due to, for example, a phenomenon referred to as "cold set." In the context of flexible materials (e.g., elastomers), the terms "cold set," "cold setting," or the like may be used herein to refer to a loss of elasticity and ability to return back to the original shape over time. The elasticity loss may be influenced by, for example, hot-cold temperature cycles.

It is desirable to provide hardware devices for enclosed environments that are capable of withstanding attacks from the enclosed environments to, for example, increase the usable lifetimes of the hardware devices and reduce a frequency of repair or maintenance events associated with deterioration of hardware. Devices and methods disclosed in embodiments herein address these concerns.

US 12,656,694 B2

13

Figure 5:
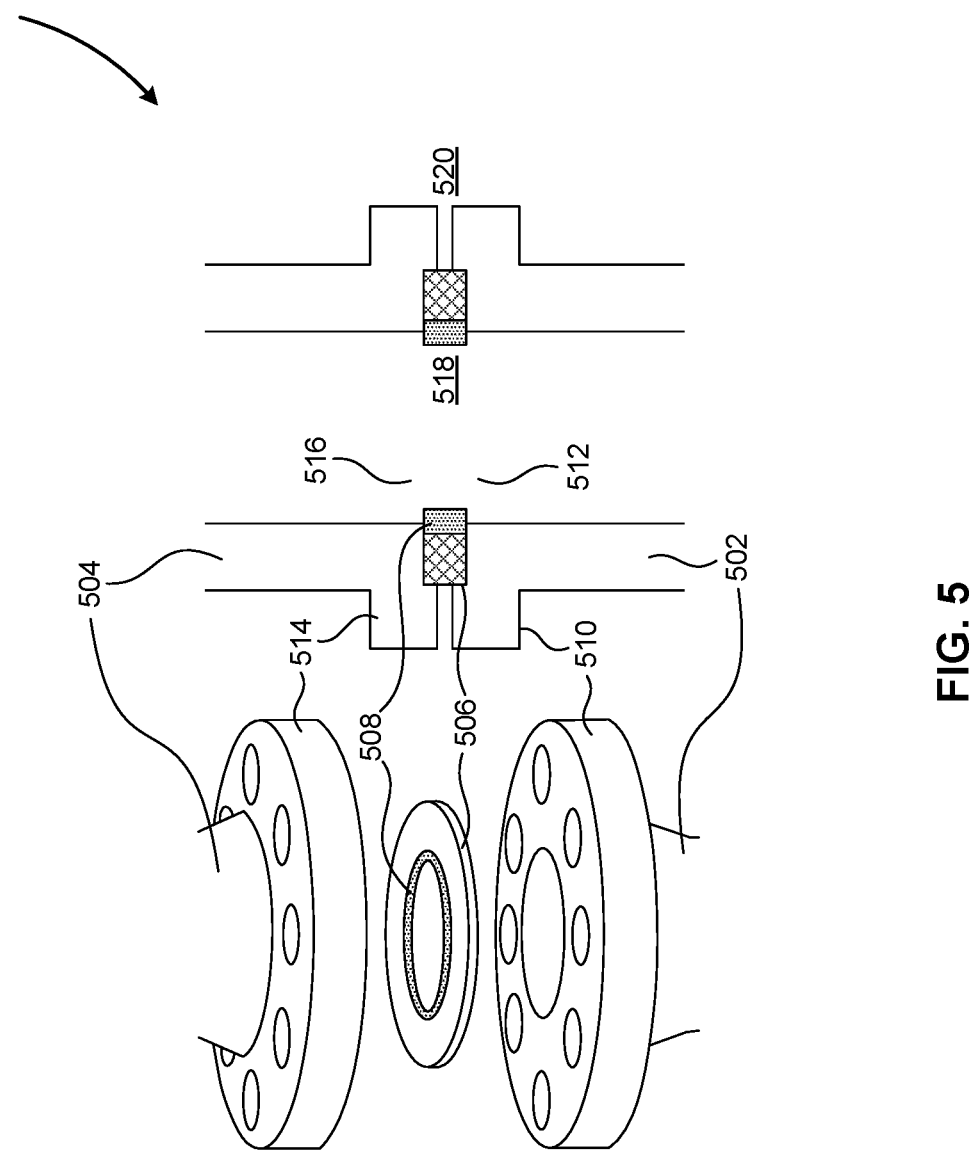
FIGS. 5-7 show connection devices, according to some embodiments.

FIG. 5 shows a connection device 500, according to some embodiments. FIG. 5 provides both exploded and cross-sectional views of connection device 500. In some embodiments, connection device 500 may be part of a larger system. For example, connection device 500 may be located in or on an enclosed system. Connection device 500 may be disposed on enclosing structure 220 (FIG. 2A). The enclosed system may be used for maintaining a given environment and the environment's parameters (e.g., a vacuum, partial vacuum, positive pressure, aerosol substances, fluid substances, or the like).

In some embodiments, connection device 500 may comprise an enclosure 502 (e.g., a first enclosure), an enclosure 504 (e.g., a second enclosure), a sealing device 506, and a protective device 508.

In some embodiment, enclosure 502 can comprise a connection structure 510 (e.g., first connection structure). Connection structure 510 can be a flange. Enclosure 502 may also comprise an opening 512 (e.g., a first opening). Connection structure 510 may correspond to opening 512. Alternatively, enclosure 502 may be a cap or cover (e.g., not an opening).

In some embodiments, enclosure 504 may comprise a connection structure 514 (e.g., a second connection structure). Connection structure 514 can be a flange. Enclosure 504 may also comprise an opening 516 (e.g., a second opening). Connection structure 514 may correspond to opening 516. Alternatively, enclosure 504 may be a cap or cover (e.g., not an opening).

In some embodiments, enclosure 502 may enclose an inner environment 518 (e.g., a first environment). Enclosure 504 may also enclose inner environment 518. Enclosures 502 and/or 504 may be structured to be access points of a larger enclosure/chamber. Alternatively, enclosures 502 and/or 504 may be conduits for connecting to a chamber or other fluid devices (e.g., a vacuum pump, hydrogen source, or the like). Openings 512 and/or 516 may provide environmental access into and/or out of a chamber. Openings 512 and/or 516 may provide line-of-sight into and/or out of a chamber (e.g., using an optical window). Enclosures 502 and/or 504 may comprise an optical window (not shown). An optical window may function as both an opening (e.g., optical access) and a cover (e.g., gas cap).

In some embodiments, enclosure 502 may be coupled to enclosure 504. The coupling isolates inner environment 518 from outer environment 520. That is, enclosures 502 and/or 504 may be used to prevent mixing of substances between inner environment 518 (inside enclosures 502 and/or 504) and outer environment 520 (outside of enclosures 502 and/or 504). A skilled person will appreciate that any suitable method of securing the coupling may be used (e.g., bolts, clamps, and/or the like).

In some embodiments, sealing device 506 may also function to prevent mixing of substances between inner environment 518 and outer environment 520. Sealing device 506 may be disposed between connection structures 510 and 514. Sealing device 506 may comprise a gasket. A material of sealing device 506 may comprise an elastomer. In one example, loss of flexibility over time may result in decreased usable lifetime of an elastomer sealing device 506.

In some embodiments, sealing device 506 may comprise a metal material, e.g., a metal gasket. In this example, the metal material of sealing device 506 may be malleable, such that it can securely seal a connection between enclosures 502 and 504 when sealing device 506 is between them. For example, a material of sealing device 506 may comprise copper, which can fulfill structural needs of a seal (e.g., snug fit, much contact area, reduced presence of gaps, and/or the like). In some examples, soft metals can be chemically reactive with certain substances (e.g., liquid tin, hydrogen radicals, and/or the like).

In some embodiments, a material of sealing device 506 may comprise a refractory metal. The refractory metal may be more chemically resistant than copper. In an example, structural needs of the connection may severely limit the types of metals that may be used.

In some embodiments, a sealing gasket material can be softer than that of the surrounding flange (connection structure). In some embodiments, the sealing gasket can bend and mold itself into shape when sandwiched by the pressure between two connecting structures 510 and 514. In one example, if sealing device 506's refractory metal is harder than a material of connecting structures 510 and 514 (e.g., stainless steel flange, but other materials are envisaged), connecting structures 510 and 514 may be bent out of shape, rendering connecting structures 510 and 514 non-reusable. It is to be appreciated that a user would take this into account when choosing sealing materials. In some embodiments, a user may choose a predetermined softness attribute, while taking into account chemical resistance imposed by the environment.

In some embodiments, protective device 508 may be used to shield and protect a material of sealing device 506, particularly those portions of sealing device 506 that are proximal and/or exposed to environment 518. A material of protective device 508 may comprise elastomer material. The elastomer material may be chemically resistant to a substance of environment 518 (e.g., a molten solid, such as tin). Since sealing device 506 may accomplish the sealing function, structural constraints on protective device 508 may be relaxed—that is, whether protective device 508 can hold a seal may be of lesser importance. In one example, the effects of elastomer cold setting may now be disregarded.

In some embodiments, sealing device 506 may have an annular shape (e.g., a ring, an ellipse ring, a rectangular ring, a planar structure with a through-hole, or the like). Protective device 508 may have an annular shape. And the shape of protective device 508 may conform to a shape of sealing device 506. An annular shape is not limited to a circular ring. A skilled artisan will appreciate that gasket shapes may be constrained by application (e.g., rectangular opening).

In some embodiments, an outer circumference of the annular shape of sealing device 506 may be disposed proximal to environment 520. An inner circumference of the annular shape of protective device 508 may be disposed proximal to environment 518. An outer circumference of the annular shape of protective device 508 may contact the inner circumference of the annular shape of sealing device 506. While the term "circumference" is used here, the term does not limit the annular shape to that of a perfect circle. That is, an annular shape may comprise an ellipse shape, a rectangle shape, or the like and, in this context, the term "circumference" adopts a definition analogous to "perimeter" or "boundary."

Figure 6:
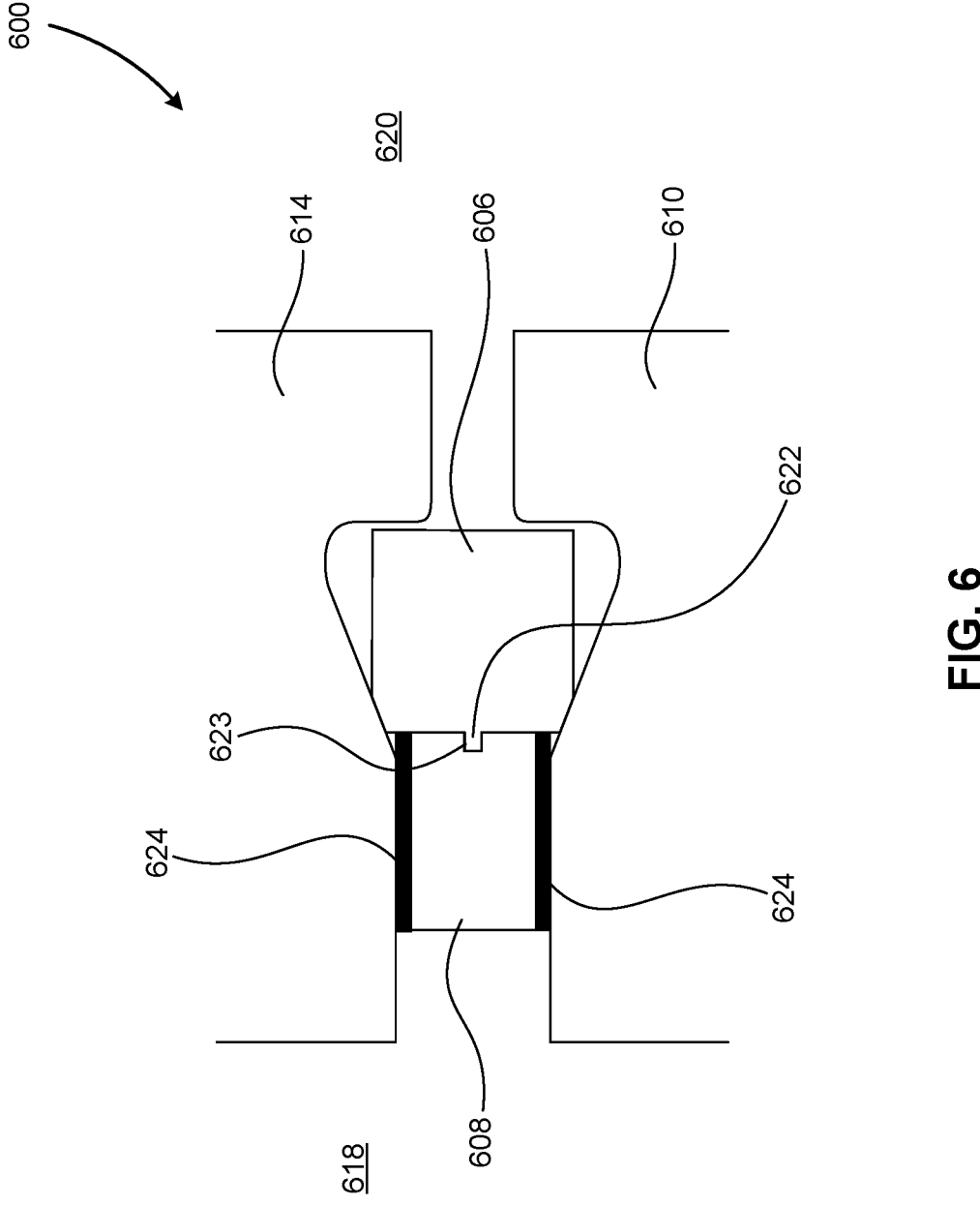

FIG. 6 shows a connection device 600, according to some embodiments. In some embodiments, connection device 600 can represent another view of connection device 500 (FIG. 5). Unless otherwise noted, structures and functions described previously for elements of FIG. 5 can also apply to similarly numbered elements of FIG. 6 (e.g., reference numbers sharing the two right-most numeric digits). Structures and functions of elements of FIG. 6 should be apparent from descriptions of corresponding elements of FIG. 5.

In some embodiments, a sealing device 606 can comprise a coupling feature 622. Coupling feature 622 may be used to couple together sealing device 606 and protective device 608. Coupling feature 622 may be a protrusion disposed at an inner circumference of sealing device 606. A matching coupling feature 623 may be comprised on protective device 608. The matching coupling feature 623 may be a recess disposed at an outer circumference of protective device 608. In one example, the recess is for mating to the protrusion on sealing device 606.

In some embodiments, a leak check may be performed for the connection between connection structures 610 and 614. In some embodiments, a leak test should be reliable when considering parameters of environment 618 (e.g., whether a particular gas is present, whether the environment is hot or cold, whether hot molten solids are present, or the like). In an example scenario, a leak check is to be performed while the connection is cold and sealing device 606 and protective device 608 have been in service for some time. Since the protective device 608 is shaped so as to shield sealing device 606 from environment 618, protective device 608 may also provide sealing function in addition to the sealing function of sealing device 606 (e.g., environment 618 is hot and caused protective device 608 to expand and form a seal). In this scenario, the results of the leak test would be inconclusive if both sealing device 606 and protective device 608 are holding a seal. For example, it may be difficult to determine whether the sealing device 606 is nominal or malfunctioning. In some embodiments, when performing a leak test a user may want to prevent protective device 608 from forming a seal.

Therefore, in some embodiments, protective device 608 may be designed so as to provide one or more leak paths 624 between sealing device 606 and an interior of an enclosure(s) that encloses environment 618 (see e.g., environment 518 and enclosures 502 and/or 504 (FIG. 5). Such leak paths may additionally allow voiding of small interstitial spaces between protective device 608 and sealing device 606. This voiding may enhance pump-down operations, during which a vacuum is applied to environment 618. The voiding may help avoid undesirable situations in which residual gas is trapped between protective device 608 and sealing device 606. Such situations may lead to "virtual leaks," in which the trapped gas gradually enters and contaminates a vacuum that has been formed in environment 618. For example, the design may simultaneously prevent a substance of the first environment 618 from accessing leak path 624 while allowing a substance of the second environment 620 to pass through the leak path during testing or during pump-down operations. For example, one or more leak paths 624 may be narrow so as to allow a leak-check gas to pass through (e.g., helium), but to present opposing forces that push against substances of environment 618 (e.g., capillary force on liquid tin). Furthermore, one or more leak paths 624 are not limited to being disposed exactly as shown in FIG. 6. For example, one or more leak paths 624 may be designed a as a channel through the body of protective device 608.

In some embodiments, one or more leak paths 624 may be temperature dependent. One or more leak paths 624 may not be present if, for example, environment 618 is hot (e.g., in order to support the flow of hydrogen gas that carries particles of molten tin or other hot debris) so as to raise the temperature of protective device 608 and cause it to expand. But one or more leak paths 624 may be present at room temperature (e.g., approximately 20° C.).

Figure 7:
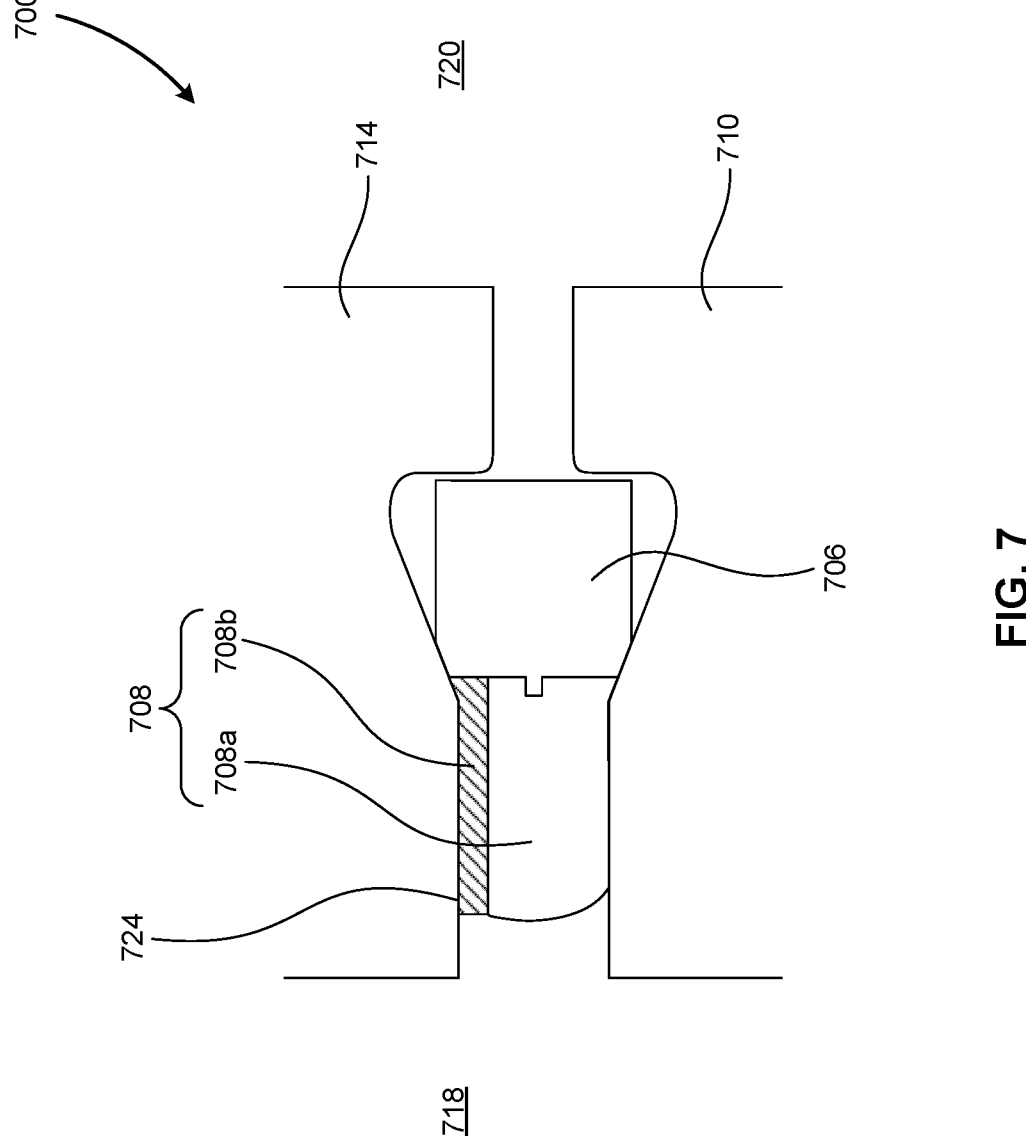

FIG. 7 shows a connection device 700, according to some embodiments. In some embodiments, connection device 700 can represent another view of connection device 500 (FIG. 6) and/or 600 (FIG. 6). Unless otherwise noted, structures and functions described previously for elements of FIGS. 5 and 6 can also apply to similarly numbered elements of FIG. 7 (e.g., reference numbers sharing the two right-most numeric digits). Structures and functions of elements of FIG. 7 should be apparent from descriptions of corresponding elements of FIGS. 5 and 6.

In some embodiments, a leak path 724 that is independent of temperature may be implemented. In some embodiments, protective device 708 can comprise a structure 708*a* and a structure 708*b*. Structure 708*a* may be an elastomer structure for providing chemical resistance shielding to sealing device 706. Structure 708*b* may be a metal structure for providing a leak path 724. Structure 708*a* may be disposed proximal to one of connection structures 710 or 714. Structure 708*b* may be disposed proximal to the other of connection structures 710 or 714, such that leak path 724 is formed. As before, leak path 724 may be shaped so as to reject a substance of environment 718, but allow through a gas used for leak checks.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," or the like as used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-100 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The embodiments can be further described using the following clauses:

1. A lithographic apparatus comprising:

an illumination system configured to illuminate a pattern of a patterning device, wherein the illumination system comprises:

a first enclosure configured to enclose a first environment, wherein the enclosure comprises a first opening and a first connection structure corresponding to the first opening;

a second enclosure comprising a second connection structure, wherein the second connection structure is configured to couple to the first connection structure to prevent mixing of substances of the first environment and a second environment outside of the first and second enclosures;

a sealing device configured to be disposed between the first and second connection structures to prevent the mixing of the substances, wherein a material of the sealing device is chemically reactive to the first environment; and a protective device, wherein the protective device is configured to be disposed on the sealing device proximal to the first environment to shield the sealing device from the first environment; and a projection system configured to project an image of the pattern onto a substrate.

2. The lithographic apparatus of clause 1, wherein:

the second enclosure further comprises a second opening corresponding to the second connection structure; and the coupling is such that a substance of the first environment is transferable between the first and second enclosures.

3. The lithographic apparatus of clause 1, wherein a material of the protective device comprises an elastomer.

4. The lithographic apparatus of clause 1, wherein the sealing device comprises a metal gasket.

5. The lithographic apparatus of clause 4, wherein:

the metal gasket has an annular shape;

an outer boundary of the annular shape of the metal gasket is configured to be disposed proximal to the second environment; and the protective device has an annular shape;

an inner circumference of the annular shape of the protective device is configured to be disposed proximal to the first environment; and an outer circumference of the annular shape of the protective device is configured to be disposed proximal the inner circumference of the annular shape of the metal gasket.

6. The lithographic apparatus of clause 1, wherein the protective device is configured to provide a leak path between the sealing device and an interior of the first and/or second enclosure and to prevent a substance of the first environment from accessing the leak path.

7. The lithographic apparatus of clause 6, wherein a shape of the leak path is temperature dependent and the leak path is present at room temperature.

8. The lithographic apparatus of clause 7, wherein the protective device comprises:

an elastomer structure configured to be disposed proximal to one of the first and second connection structures; and a metal structure configured to be disposed proximal to another of the first and second connection structures, such that the leak path is formed.

9. The lithographic apparatus of clause 1, wherein:

the first environment comprises a molten solid that is configured to be chemically reactive with the material of the sealing device; and a material of the protective device is configured to be chemically resistant to the molten solid.

10. The lithographic apparatus of clause 1, wherein the sealing device comprises a coupling feature configured to couple to the protective device.

11. A system comprising:

a first enclosure configured to enclose a first environment, wherein the enclosure comprises a first opening and a first connection structure corresponding to the first opening;

a second enclosure comprising a second connection structure, wherein the second connection structure is configured to couple to the first connection structure to prevent mixing of substances between the first environment and a second environment outside of the first and second enclosures;

a sealing device configured to be disposed between the first and second connection structures to prevent the mixing of the substances, wherein a material of the sealing device is chemically reactive to the first environment; and a protective device, wherein the protective device is configured to be disposed on the sealing device proximal to the first environment to shield the sealing device from the first environment.

12. The system of clause 11, wherein:

the second enclosure further comprises a second opening corresponding to the second connection structure; and the coupling is such that the first environment is transferable between the first and second enclosures.

13. The system of clause 11, wherein a material of the protective device comprises an elastomer.

14. The system of clause 11, wherein the sealing device comprises a metal gasket.

15. The system of clause 14, wherein:

the metal gasket has an annular shape;

an outer boundary of the annular shape of the metal gasket is configured to be disposed proximal to the second environment; and the protective device has an annular shape;

an inner circumference of the annular shape of the protective device is configured to be disposed proximal to the first environment; and an outer circumference of the annular shape of the protective device is configured to contact the inner circumference of the annular shape of the metal gasket.

16. The system of clause 11, wherein the protective device is configured to provide a leak path between the sealing device and an interior of the first and/or second enclosure and the sealing device and to prevent a substance of the first environment from accessing the leak path.

17. The system of clause 16, wherein a shape of the leak path is configured to be temperature dependent and the leak path is present at room temperature.

18. The system of clause 17, wherein the protective device comprises:

an elastomer structure configured to be disposed proximal to one of the first and second connection structures; and a metal structure configured to be disposed proximal to another of the first and second connection structures, such that the leak path is formed.

19. The system of clause 11, wherein:

the first environment comprises a molten solid that is configured to be chemically reactive with the material of the sealing device; and a material of the protective device is configured to be chemically resistant to the molten solid.

20. An illumination system comprising:

an extreme ultraviolet radiation source;

a first enclosure configured to enclose a first environment, wherein the enclosure comprises a first opening and a first connection structure corresponding to the first opening;

a second enclosure comprising a second connection structure, wherein the second connection structure is configured to couple to the first connection structure to prevent mixing of substances between the first environment and a second environment outside of the first and second enclosures;

a sealing device configured to be disposed between the first and second connection structures to prevent the mixing of the substances, wherein a material of the sealing device is configured to be chemically reactive to the first environment; and a protective device, wherein the protective device is configured to be disposed on the sealing device proximal to the first environment to shield the sealing device from the first environment.

Still other implementations are within the scope of the following claims.

The invention claimed is:

1. A lithographic apparatus comprising:

an illumination system configured to illuminate a pattern of a patterning device, wherein the illumination system comprises:

a first enclosure configured to enclose a first environment, wherein the enclosure comprises a first opening and a first connection structure corresponding to the first opening;

a second enclosure comprising a second connection structure, wherein the second connection structure is configured to couple to the first connection structure to prevent mixing of substances of the first environment and a second environment outside of the first and second enclosures;

a sealing device configured to be disposed between the first and second connection structures to prevent the mixing of the substances, wherein a material of the sealing device is chemically reactive to the first environment; and a protective device, wherein the protective device is configured to be disposed on the sealing device proximal to the first environment to shield the sealing device from the first environment; and a projection system configured to project an image of the pattern onto a substrate.

2. The lithographic apparatus of claim 1, wherein:

the second enclosure further comprises a second opening corresponding to the second connection structure; and the coupling is such that a substance of the first environment is transferable between the first and second enclosures.

3. The lithographic apparatus of claim 1, wherein a material of the protective device comprises an elastomer.

4. The lithographic apparatus of claim 1, wherein the sealing device comprises a metal gasket.

5. The lithographic apparatus of claim 4, wherein:

the metal gasket has an annular shape;

an outer boundary of the annular shape of the metal gasket is configured to be disposed proximal to the second environment; and the protective device has an annular shape;

an inner circumference of the annular shape of the protective device is configured to be disposed proximal to the first environment; and an outer circumference of the annular shape of the protective device is configured to be disposed proximal the inner circumference of the annular shape of the metal gasket.

6. The lithographic apparatus of claim 1, wherein the protective device is configured to provide a leak path between the sealing device and an interior of the first and/or second enclosure and to prevent a substance of the first environment from accessing the leak path.

7. The lithographic apparatus of claim 6, wherein a shape of the leak path is temperature dependent and the leak path is present at room temperature.

8. The lithographic apparatus of claim 7, wherein the protective device comprises:

an elastomer structure configured to be disposed proximal to one of the first and second connection structures; and a metal structure configured to be disposed proximal to another of the first and second connection structures, such that the leak path is formed.

9. The lithographic apparatus of claim 1, wherein:

the first environment comprises a molten solid that is configured to be chemically reactive with the material of the sealing device; and a material of the protective device is configured to be chemically resistant to the molten solid.

10. The lithographic apparatus of claim 1, wherein the sealing device comprises a coupling feature configured to couple to the protective device.

11. A system comprising:

a first enclosure configured to enclose a first environment, wherein the enclosure comprises a first opening and a first connection structure corresponding to the first opening;

a second enclosure comprising a second connection structure, wherein the second connection structure is configured to couple to the first connection structure to prevent mixing of substances between the first environment and a second environment outside of the first and second enclosures;

a sealing device configured to be disposed between the first and second connection structures to prevent the mixing of the substances, wherein a material of the sealing device is chemically reactive to the first environment; and a protective device, wherein the protective device is configured to be disposed on the sealing device proximal to the first environment to shield the sealing device from the first environment.

12. The system of claim 11, wherein:

the second enclosure further comprises a second opening corresponding to the second connection structure; and the coupling is such that a substance of the first environment is transferable between the first and second enclosures.

13. The system of claim 11, wherein a material of the protective device comprises an elastomer.

14. The system of claim 11, wherein the sealing device comprises a metal gasket.

15. The system of claim 14, wherein:

the metal gasket has an annular shape;

an outer boundary of the annular shape of the metal gasket is configured to be disposed proximal to the second environment; and the protective device has an annular shape;

an inner circumference of the annular shape of the protective device is configured to be disposed proximal to the first environment; and an outer circumference of the annular shape of the protective device is configured to contact the inner circumference of the annular shape of the metal gasket.

16. The system of claim 11, wherein the protective device is configured to provide a leak path between the sealing device and an interior of the first and/or second enclosure and the sealing device and to prevent a substance of the first environment from accessing the leak path.

17. The system of claim 16, wherein a shape of the leak path is configured to be temperature dependent and the leak path is present at room temperature.

18. The system of claim 17, wherein the protective device comprises:

an elastomer structure configured to be disposed proximal to one of the first and second connection structures; and a metal structure configured to be disposed proximal to another of the first and second connection structures, such that the leak path is formed.

19. The system of claim 11, wherein:

the first environment comprises a molten solid that is configured to be chemically reactive with the material of the sealing device; and a material of the protective device is configured to be chemically resistant to the molten solid.

20. An illumination system comprising:

an extreme ultraviolet radiation source;

a first enclosure configured to enclose a first environment, wherein the enclosure comprises a first opening and a first connection structure corresponding to the first opening;

a second enclosure comprising a second connection structure, wherein the second connection structure is configured to couple to the first connection structure to prevent mixing of substances between the first environment and a second environment outside of the first and second enclosures;

a sealing device configured to be disposed between the first and second connection structures to prevent the mixing of the substances, wherein a material of the sealing device is configured to be chemically reactive to the first environment; and a protective device, wherein the protective device is configured to be disposed on the sealing device proximal to the first environment to shield the sealing device from the first environment.

\* \* \* \* \*